US010529401B2

(12) United States Patent
Vimercati

(10) Patent No.: US 10,529,401 B2
(45) Date of Patent: Jan. 7, 2020

(54) ACCESS LINE MANAGEMENT FOR AN ARRAY OF MEMORY CELLS

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/971,639

(22) Filed: May 4, 2018

(65) Prior Publication Data
US 2019/0341092 A1 Nov. 7, 2019

(51) Int. Cl.
*G11C 11/22* (2006.01)

(52) U.S. Cl.
CPC ........ *G11C 11/2259* (2013.01); *G11C 11/221* (2013.01)

(58) Field of Classification Search
CPC ............................ G11C 11/2259; G11C 11/221
USPC ......................................................... 365/145
See application file for complete search history.

(56) References Cited

U.S. PATENT DOCUMENTS

| | | | | |
|---|---|---|---|---|
| 4,491,936 A | * | 1/1985 | Eaton, Jr. .............. | G11C 11/409 365/149 |
| 6,845,031 B2 | * | 1/2005 | Kang ...................... | G11C 11/22 365/145 |
| 7,257,013 B2 | * | 8/2007 | Roehr .................. | G11C 13/0011 365/148 |
| 9,583,183 B2 | * | 2/2017 | Fainzilber ........... | G11C 11/5642 |
| 2005/0276089 A1 | | 12/2005 | Madan et al. | |
| 2008/0144351 A1 | | 6/2008 | Eliason et al. | |
| 2009/0168490 A1 | | 7/2009 | Madan | |
| 2017/0278558 A1 | | 9/2017 | Izumi et al. | |

FOREIGN PATENT DOCUMENTS

WO 2018031474 A1 2/2018

OTHER PUBLICATIONS

ISA/KR, International Search Report and Written Opinion of the International Searching Authority, Int'l. Appl. No. PCT/US2019/025636, dated Jul. 18, 2019, Korean Intellectual Property Office, Seo-gu, Daejeon, Republic of Korea, 12 pgs.

\* cited by examiner

*Primary Examiner* — Vu A Le
(74) *Attorney, Agent, or Firm* — Holland & Hart LLP

(57) ABSTRACT

Methods, systems, and devices for access line management for an array of memory cells are described. Some memory devices may include a plate that is coupled with memory cells associated with a plurality of digit lines and/or a plurality of word lines. Because the plate is coupled with a plurality of digit lines and/or word lines, unintended cross-coupling between various components of the memory device may be significant. To mitigate the impact of unintended cross-coupling between various components, the memory device may float unselected word lines during one or more portions of an access operation. Accordingly, a voltage of each unselected word line may relate to the voltage of the plate as changes in plate voltage may occur.

25 Claims, 10 Drawing Sheets

US 10,529,401 B2

1

ACCESS LINE MANAGEMENT FOR AN ARRAY OF MEMORY CELLS

BACKGROUND

The following relates generally to managing access for memory cells and more specifically to access line management for an array of memory cells.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics.

2

Figure 8:
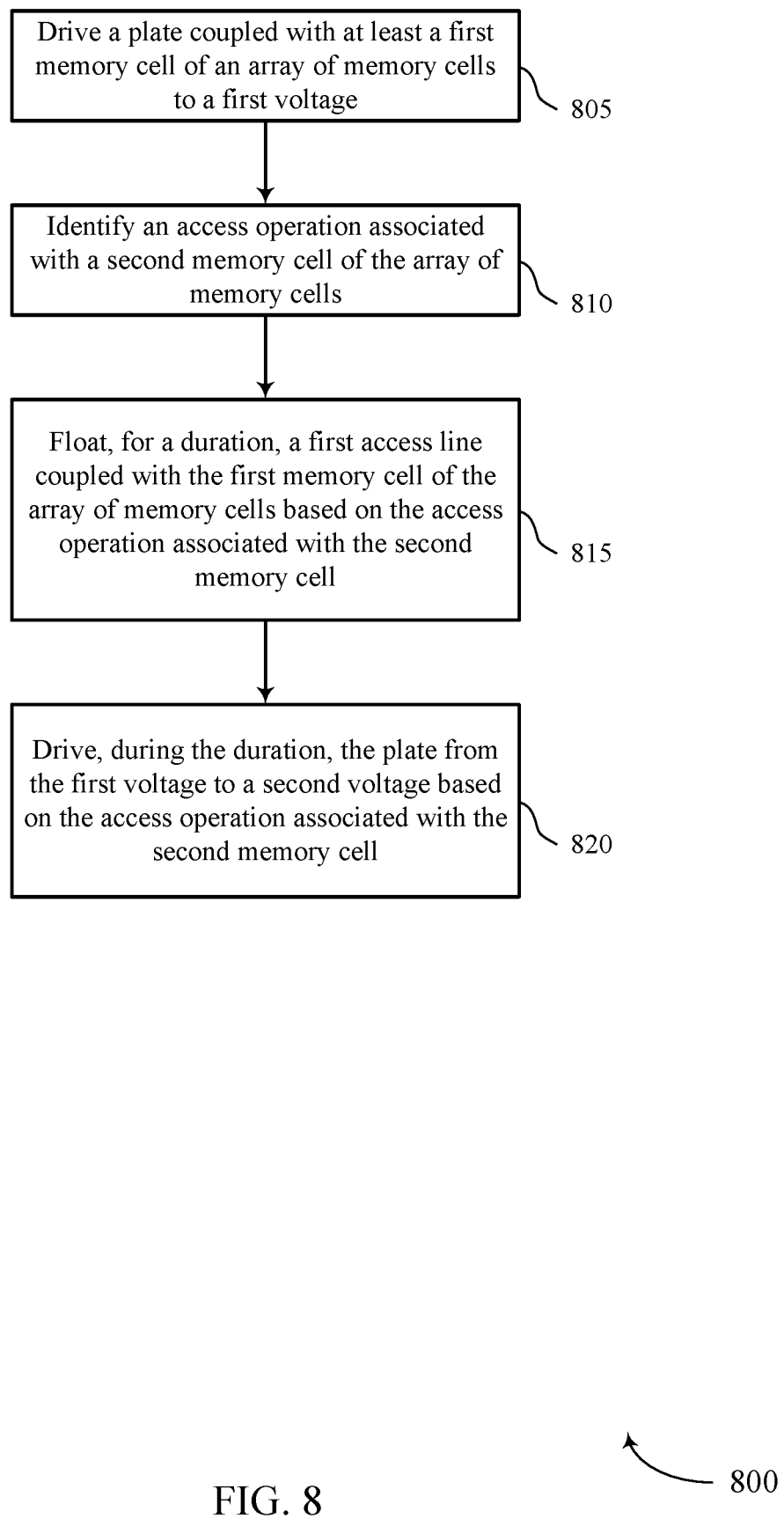
Figure 9:
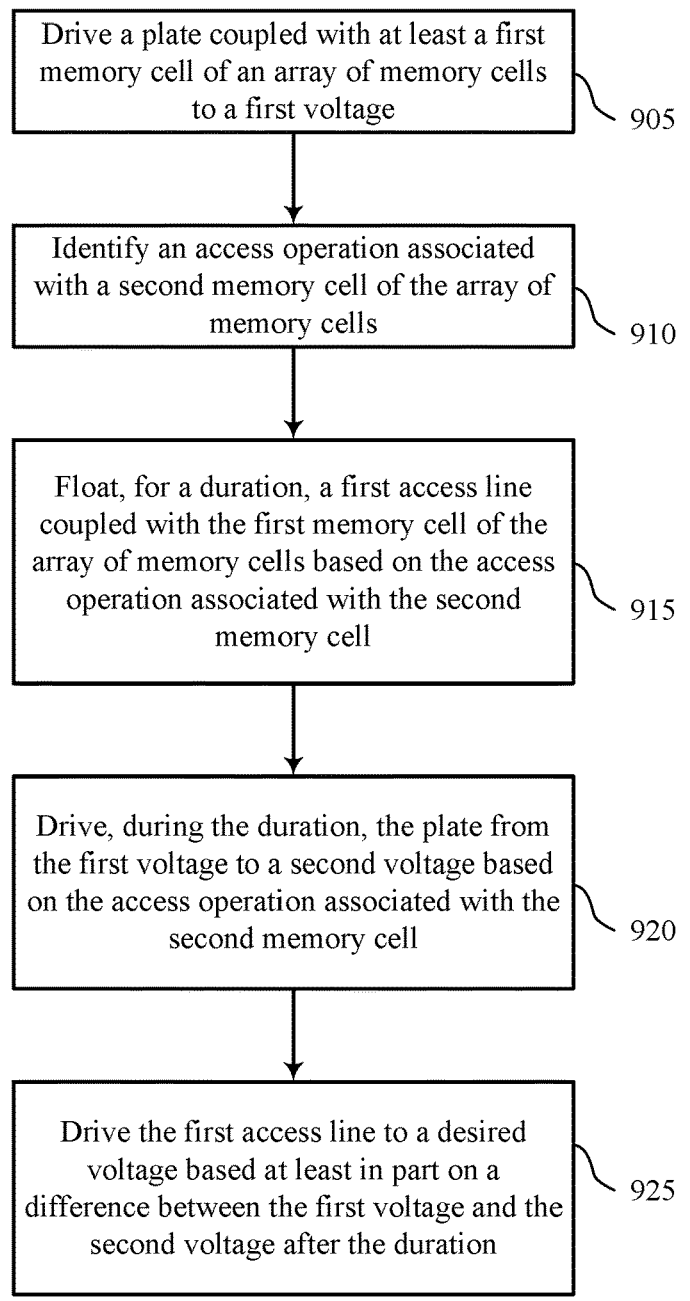
Figure 10:
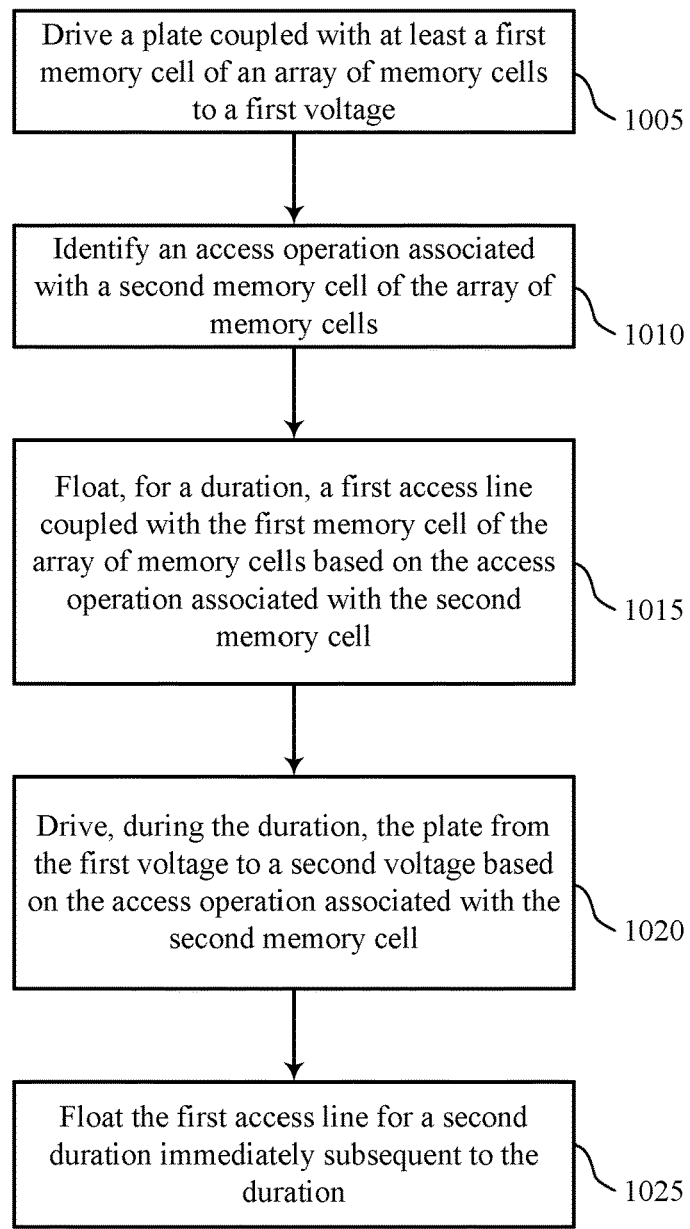

FIGS. 8 through 10 illustrate methods for access line management for an array of memory cells in accordance with examples of the present disclosure

DETAILED DESCRIPTION

Some memory arrays may include a plate that is common to a plurality of memory cells, the memory cells also being associated with a plurality of digit lines and/or a plurality of word lines. As a voltage of the plate (and thus also that of an associated plate line) fluctuates in connection with an access operation for a selected memory cell (e.g., between a high voltage and a low voltage), some memory devices may maintain each word line for the unselected memory cells common to the plate (which may be referred to as unselected word lines) at a fixed voltage. This may result in leakage currents and associated power loss due to capacitive (e.g., parasitic) cross-coupling associated with each unselected word line (e.g., between each unselected word line and the common plate or plate line). Where a plate is common to many memory cells, the amount of capacitance (e.g., parasitic capacitance) and unintended cross-coupling between the plate and unselected word lines, and thus the amount of associated power loss, may be significant. Along with additional power consumption by the memory array, parasitic signals due to such unintended cross-coupling may disturb the logic states stored on unselected memory cells. For example, the parasitic signaling may result in errors being introduced into the data by changing the states stored on memory cells, or by introducing errors into access operations, among other effects.

Techniques are described herein for managing access lines (e.g., unselected access lines, unselected word lines) during an access operation in a memory device that may include a plate common to memory cells associated with a plurality of digit lines and/or a plurality of word lines (either directly or indirectly). For example, to reduce or mitigate the impact of unintended cross-coupling, the memory device may float multiple unselected access lines (e.g., word lines) when changing the voltage of a plate. Thus, the memory device may float the unselected word lines during one or more portions of an access operation for a selected memory cell, and in some cases for a duration prior to or subsequent to the access operation. Floating the unselected access lines may facilitate a voltage of each unselected access line tracking (e.g., maintaining a constant or near-constant differential with) the voltage of the plate and plate line, resulting in overall lower power consumption of the memory array, as well as fewer errors associated with the unselected memory cells. As used herein, floating a node may refer to electrically isolating the node from any defined voltage source.

Features of the disclosure introduced above are further described below in the context of FIGS. 1-3. Specific examples are then described with reference to FIGS. 4A-4B and 5A-5B. These and other features of the disclosure are further illustrated by and described with reference to apparatus diagrams, system diagrams, and flowcharts that relate to techniques for access line management for an array of memory cells.

Figure 1:
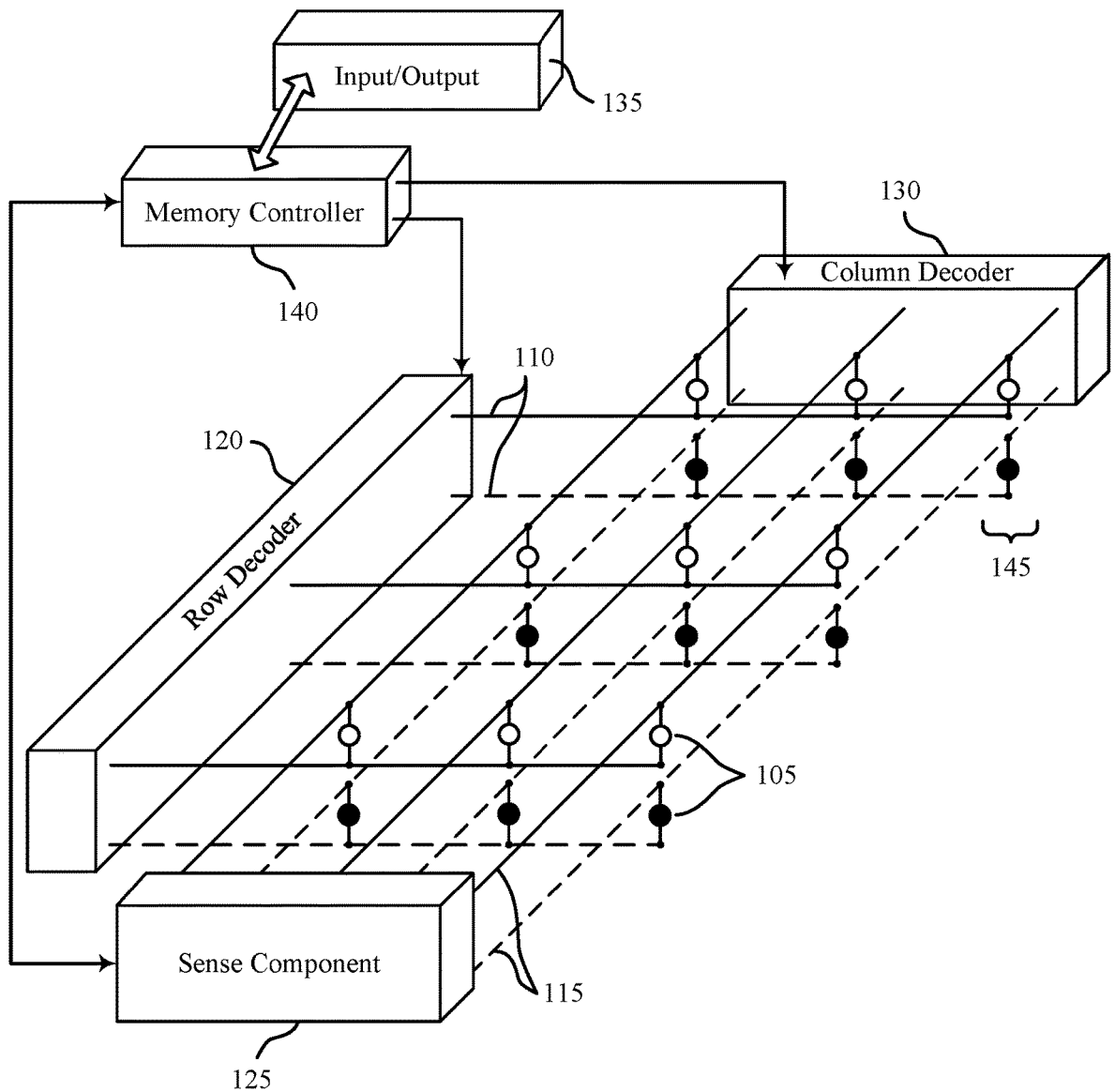
FIG. 1 illustrates an example of a memory array that supports access line management for an array of memory cells in accordance with examples of the present disclosure.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145. In some cases, the memory array 100 may be referred to as a memory device 100.

Each row of memory cells 105 is connected to an access line 110, and each column of memory cells 105 is connected to a bit line 115. Access lines 110 and bit lines 115 may be substantially perpendicular to one another to create an array. In addition, each row of memory cells 105 may be coupled to at least one plate line (not shown). As used herein, the terms plate node, plate line, or simply plate may be used interchangeably. As shown in FIG. 1, each memory cell 105 in a memory cell stack 145 may be coupled to separate conductive lines such as bit lines 115. In other examples (not shown), two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third deck may share an access line 110 with a lower deck. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting access lines 110 and digit lines 115. Access lines 110 may also be known as word lines 110, and bit lines 115 may also be known digit lines 115. Generally, the term access line may refer to word lines, bit lines, digit lines, or plate lines. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. Upon selecting a memory cell 105, the resulting signal may be used to determine the stored logic state.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, and multiple digit lines 115. Thus, by activating a word line 110 and a digit line 115, the memory cell 105 at their intersection may be accessed. As is described in more detail below, by floating an unselected access line (e.g., an unselected word line), the effects of unintended cross-coupling may be mitigated. For example, the plate may be coupled with a plurality of memory cells, which may in turn be coupled (directly or indirectly) with a plurality of word lines and a plurality of digit lines. During a period associated with an access operation of one memory cell, the word lines associated with the remaining unselected memory cells coupled with the plate may be floated. By floating the unselected word lines, the effects associated with cross-coupling between the unselected word lines and the plate may be mitigated.

Upon accessing, a memory cell 105 may be read, or sensed, by sense component 125 to determine the stored state of the memory cell 105. For example, after accessing the memory cell 105, the capacitor of memory cell 105 may discharge onto its corresponding digit line 115. Discharging the capacitor may result from biasing, or applying a voltage, to the capacitor. The discharging may cause a change in the voltage of the digit line 115, which sense component 125 may compare to a reference voltage (not shown) in order to determine the stored state of the memory cell 105. Exemplary access operations are described below with reference to FIGS. 4A through 4B, and 5A through 5B.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. As described in more detail below, unselected word lines may be floated during a period associated with an access operation to mitigate effects associated with cross-coupling of the word lines.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written. But in non-volatile memory, such as an array that employs ferroelectrics, accessing the memory cell 105 may not destroy the logic state and, thus, the memory cell 105 may not require re-writing after accessing. In some examples, multiple levels of memory cells may be coupled to the same plate. Such a plate configuration may result in a smaller amount of area used to connect higher levels memory cells to the substrate.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery.

The memory controller 140 may control the operation (e.g., read, write, re-write, refresh, decharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some examples, memory controller 140 may be configured to float one or more access lines (e.g., word lines 110) of memory array 100 during one or more periods associated with an access operation. For example, memory controller 140 may identify an access operation associated with a selected memory cell 104. Upon identifying the access operation, memory controller 140 may initiate driving a plate (not shown) from a first voltage to a second voltage based at least in part on the access operation associated with the selected memory cell 105. In some examples, the memory controller 140 may initiate floating an access line (e.g., a word line 110) for an unselected memory cell 105 based at least in part on the access operation associated with the selected memory cell 105. The memory controller 140 may be configured to initiate floating the unselected access line simultaneously with or before initiating driving the plate to the second voltage. Accordingly, during an access operation, memory controller 140 may select one access line while other access lines of memory array 100 (e.g., other access lines associated with unselected memory cells 105 that share a plate with the selected memory cell 105) are floated. By floating the unselected access lines, undesired effects associated with cross-coupling between the unselected access lines and other aspects memory array 100 (e.g., a plate common to a selected memory cell 105 and one or more unselected memory cells 105) may be avoided or mitigated.

Figure 2:
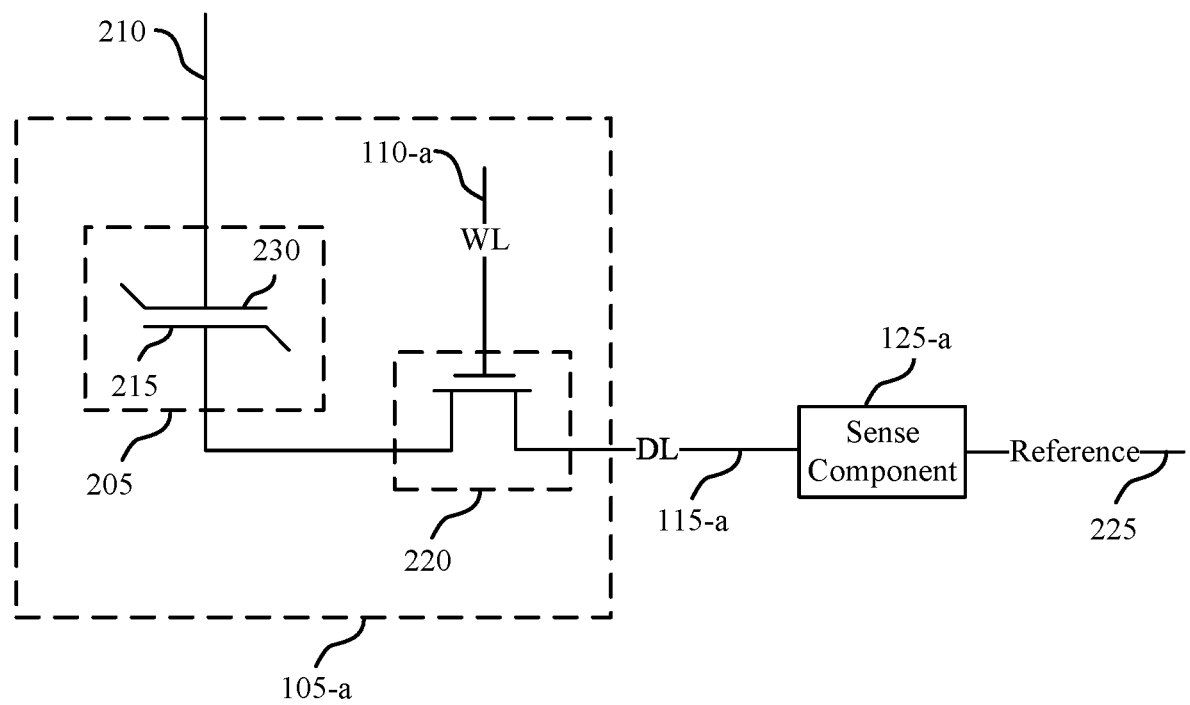
FIG. 2 illustrates an example of a circuit that supports techniques for access line management in accordance with examples of the present disclosure.

FIG. 2 illustrates an example circuit 200 in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a material (e.g., a ferroelectric material) positioned between them. The orientation of cell plate 230 and cell bottom 215 may be flipped without changing the operation of memory cell 105-a. Circuit 200 also includes selection component 220 and reference line 225.

Cell plate 230 may be accessed via plate line 210 and cell bottom 215 may be accessed via digit line 115-a. In some cases, some memory cells 105-a may share access lines (e.g., digit lines, word lines, plate lines) with other memory cells. For example, a digit line 115-a may be shared with memory cells 105-a in a same column, a word line 110-a may be shared with memory cells 105-a in the same row, and a plate line 210 (and a corresponding plate 230) may be shared with memory cells 105-a in the same section, tile, deck, or even multiple decks. As described above, various states may be stored by charging or discharging the capacitor 205. In many examples, a connector or socket may be used to couple digit lines 115-a or plate lines 210 of upper level levels of memory cells to a substrate positioned below the arrays of memory cells. The size of the connector or socket may be modified based on the configuration of the plate lines in the memory array.

In some cases, a memory array 100 that includes a plate (not shown) that is coupled with multiple memory cells 105 associated with a plurality of different word lines 110 and/or digit lines 115 may have unique access operations as described herein. For example, unselected word lines, if maintained at a fixed voltage while a plate voltage changes, may result in unwanted leakage or power consumption due to capacitance between the unselected word lines and the plate, or between the unselected word lines and one or more digit lines. Consequently, techniques are provided herein for mitigating or reducing the impact of such capacitance or cross-coupling during an access operation of a memory array that includes a plate common to more than one memory cell 105, which may be referred to as a common plate.

The stored state of capacitor 205 may be read or sensed by operating various elements represented in circuit 200. Capacitor 205 may be in electronic communication with digit line 115-*a*. For example, capacitor 205 can be isolated from digit line 115-*a* when selection component 220 is deactivated, and capacitor 205 can be connected to digit line 115-*a* when selection component 220 is activated. Activating selection component 220 may be referred to as selecting memory cell 105-*a*. In some cases, selection component 220 is a transistor and its operation is controlled by applying a voltage to the transistor gate, where the voltage magnitude is greater than the threshold magnitude of the transistor. Word line 110-*a* may activate the selection component 220; for example, a voltage applied to word line 110-*a* is applied to the transistor gate, connecting capacitor 205 with digit line 115-*a*. As is described in more detail below, the access operations (e.g., read operation or write operation) may be conducted based on the plate configuration of the memory array. For example, one or more unselected access lines (e.g., unselected word lines; not shown) may be floated. By floating the unselected access lines, negative cross-coupling effects may be prevented or mitigated.

In other examples, the positions of selection component 220 and capacitor 205 may be switched, such that selection component 220 is connected between plate line 210 and cell plate 230 and such that capacitor 205 is between digit line 115-*a* and the other terminal of selection component 220. In this embodiment, selection component 220 may remain in electronic communication with digit line 115-*a* through capacitor 205. This configuration may be associated with alternative timing and biasing for read and write operations.

In some cases, due to a ferroelectric material between the plates of capacitor 205, capacitor 205 may not discharge upon connection to digit line 115-*a*. In one scheme, to sense the logic state stored by a ferroelectric capacitor 205, word line 110-*a* may be biased to select memory cell 105-*a* and a voltage may be applied to plate line 210. In some cases, digit line 115-*a* is virtually grounded and then isolated from the virtual ground, prior to biasing the plate line 210 and word line 110-*a*. Biasing the plate line 210 may result in a voltage difference (e.g., plate line 210 voltage minus digit line 115-*a* voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-*a* based on the charge stored on capacitor 205. Operation of memory cell 105-*a* by varying the voltage to cell plate 230 may be referred to as "moving cell plate." As is described in more detail below, some aspects of the access operations (e.g., read operation or write operation) may be modified based on the plate configuration of the memory array.

The change in voltage of digit line 115-*a* may depend on its intrinsic capacitance. That is, as charge flows through digit line 115-*a*, some finite charge may be stored in digit line 115-*a* and the resulting voltage depends on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF)). The resulting voltage of digit line 115-*a* may then be compared to a reference (e.g., a voltage of reference line 225) by sense component 125-*a* in order to determine the stored logic state in memory cell 105-*a*. Other sensing processes may be used.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference line 225, which may be a reference voltage. The sense amplifier output may be driven to the higher (e.g., a positive) or lower (e.g., negative or ground) supply voltage based on the comparison. For instance, if digit line 115-*a* has a higher voltage than reference line 225, then the sense amplifier output may be driven to a positive supply voltage.

In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 with reference to FIG. 1.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high.

Figure 3:
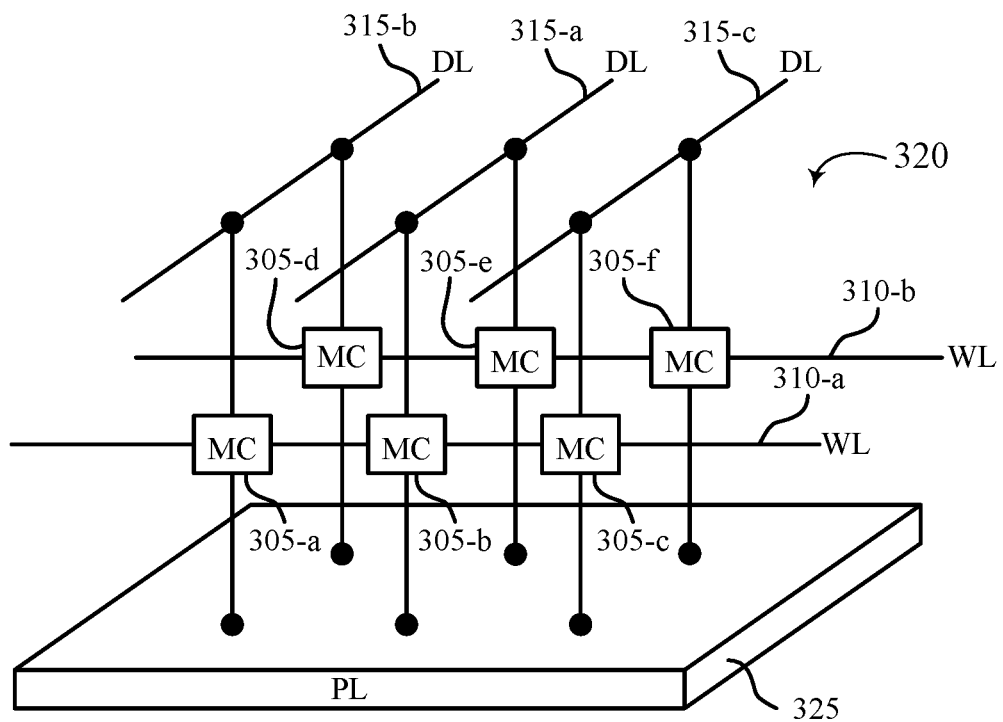
FIG. 3 illustrates an example of a memory device that supports techniques for access line management in accordance with examples of the present disclosure.

FIG. 3 illustrates an example of a memory device 300 that supports techniques for access line management for an array of memory cells in accordance with examples of the present disclosure. The memory device 300 may include a plurality memory cells 305 coupled with one or more word lines 310 and one or more digit lines 315 to form an array 320. The memory device 300 may include a plate 325 that is coupled with one or more memory cells 305 associated with multiple word lines 310 or multiple digit lines 315 in the array 320. In some examples, the memory array 320 may include a plurality of ferroelectric memory cells or other capacitor-based memory cells.

For example, the plate 325 may be coupled with memory cells 305 that are associated with a first word lines 310-*a* and a second word line 310-*b* and/or memory cells 305 that are associated with a first digit line 315-*a*, a second digit line 315-*b*, and a third digit line 315-*c*. In some cases, a single plate 325 may be coupled with memory cells 305 associated with (e.g., coupled with) any number of word lines 310 or digit lines. The memory device 300 may be an example of or included in the memory array 100 described with reference to FIG. 1.

In some examples, a quantity of plate nodes in an array of memory cells may be reduced relative to alternative architectures by having one or more plates that are each common to multiple memory cells. This may result in more efficient use of die area in the memory array and/or more efficient use of power during access operations. In some cases, a plate driver associated with the plate 325 may be positioned outside of the memory array 320, thereby providing more space to other components of the array 320. In addition, by reducing the number of plates, the memory device 300 may be configured to reduce a number of plate drivers in an array of memory cells relative to alternative architectures.

In some cases, a single plate 325 may be coupled with memory cells 305 of different decks. In some such cases, the single plate 325 may be coupled with memory cells of a first deck and memory cells of a second deck. Such arrangements may result in even more reductions in plates and plate drivers in the array 320.

Having a plate 325 common to multiple memory cells may create an associated risk of undesirable coupling between different components of the array 320. During an access operation of a selected memory cell, unselected access lines (e.g., unselected word lines) may be susceptible to cross-coupling with one or more digit lines 315 and the plate 325 during the access operation. In some cases, the cross-coupling may result in parasitic signals (e.g., leakage currents) between each unselected word line 310 and a respective digit line 315, and between each unselected word line 310 and the plate 325. Because such parasitic effects may occur at every unselected word line 310, in a memory array containing multiple word lines and multiple digit lines, the impact of such effects may be significant. In some examples, such cross-coupling and related effects may "disturb" the logic states stored on unselected memory cells. For example, the parasitic signals may cause a charge to be stored on a middle electrode of an unselected memory cell 305. In some cases, such accumulation or other parasitic effects may result in additional power consumption by the memory device 300.

During an access operation, usually only a small number of memory cells (e.g., one or more) are accessed in a given segment of the array 320. In the illustrative example of FIG. 3, memory cell 305-b may be the selected memory cell for an access operation (e.g., read, write, and/or precharge) and memory cells 305-a, 305-c, 305-d, 305-e, and 305-f may be unselected memory cells. Each of these memory cells 305 are coupled with a common plate 325. In such an example, parasitic signals (e.g., due to unintended capacitive cross-coupling) may develop between the unselected word line 310-b and the unselected digit lines (e.g., 315-b, 315-c), and between each of the unselected word lines and the plate 325.

In some cases, when the plate 325 is biased from a first state to a second state (e.g., driven from a first voltage to a second voltage), parasitic signals may occur between a number of components. For example, biasing the plate 325 to a first voltage while maintaining the unselected word lines 315-b, 315-c at a fixed voltage may cause parasitic signals due to capacitance between each unselected word line and a respective digit line, and between each unselected word line and the plate 325. To avoid or mitigate such undesired effects, the unselected word lines 315-b, 315-c may be floated with respect to the plate 325. For example, if the plate 325 is biased from a first voltage to a second voltage as part of an access operation for the selected memory cell 305-b, the unselected digit lines 315-b, 315-c may be floated as the voltage of the plate 325 changes and, in turn, may track (e.g., maintain a common differential with) the voltage of the plate 325.

Such operations may be carried out on any combination of unselected word lines. For example, a memory array may include a plurality of word lines (e.g., 1024 word lines) and a plurality of digit lines (e.g., 1024 digit lines). During a single access operation a large quantity of word lines may be unselected (e.g., 1023 unselected word lines). Floating any combination of unselected word lines (e.g., any of 1023 unselected word lines) during a period associated with an access operation associated with a selected word line may result in improved performance for the entire memory device 300 (e.g., reduced power consumption, increased reliability).

The memory cells 305 may be examples of the memory cells 105 described with reference to FIG. 1. In some cases, the memory cells 305 may be ferroelectric memory cells, DRAM memory cells, NAND memory cells, phase-change memory cells, or any other type of memory cells. The word lines 310 may be examples of word lines 110 described with reference to FIG. 1. The digit lines 315 may be examples of the digit lines 115 described with reference to FIG. 1. The plate 325 may be an example of and may be related to the plate 230 and/or the plate line 210 described with reference to FIG. 2.

By way of example, FIG. 3 may illustrate a memory array 320 that includes a first memory cell 305-a and a second memory cell 305-f. As described above, the memory array 320 may include a plate 325 coupled with the first memory cell 305-a and the second memory cell 305-f, and may include a plate line driver (not shown) coupled with the plate 325. In some examples, a first access line 310-a may be coupled with the first memory cell 305-a, and an access line driver (not shown) may be coupled with the first access line 310-a. In some examples, the access line driver may be configured to float the first access 310-a line for a duration based at least in part on an access operation associated with the second memory cell 305-f. In some examples, each of memory cells 305-a, 305-b, 305-c, 305-d, and 305-e may be floated for the duration based at least in part on the access operation associated with memory cell 305-f. In some examples, the plate line driver may be configured to drive the plate 325 to a first voltage before the duration, and may be configured to drive the plate 325 to a second voltage during the duration based at least in part on the access operation associated with the second memory cell 305-f.

Figure 4A:
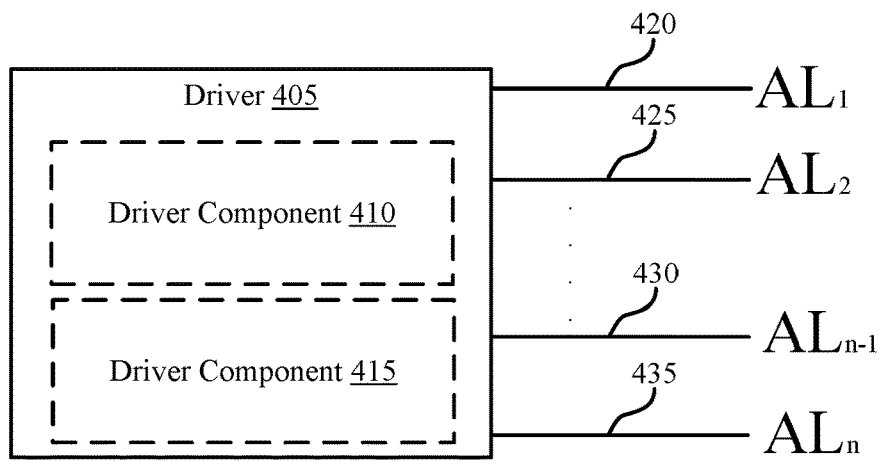
FIGS. 4A and 4B illustrate an example of a memory device and timing diagram that support techniques for access line management in accordance with examples of the present disclosure.

FIG. 4A illustrates examples of a memory device 400-a that supports techniques for access line management for an array of memory cells in accordance with examples of the present disclosure. In some examples, memory device 400-a may include driver 405, which may be referred to as memory driver 405. Memory driver 405 may be coupled with any number of access lines, and may facilitate an access operation of one or more memory cells (e.g., memory cells 305-a through 305-f as described with reference to FIG. 3). Memory driver 405 may be coupled with, for example, access line 420, access line 425, access line 430, and access line 435. Each of access lines 420, 425, 430, and 435 may be examples of a word line (e.g., word lines 310-a, 310-b as described with reference to FIG. 3) of a memory array. Memory driver 405 may include various sub-components, such as driver component 410 and driver component 415. In other examples (not shown), memory driver 405 may contain any number of sub-components (e.g., any number of driver components).

As described above, each of access lines 420, 425, 430, and 435 may be examples of a word line of a memory array (e.g., memory array 320 as described with reference to FIG. 3). For example, access line 420 may be referred to as a first access line 420 and access line 425 may be referred to as a second access line 425. Additionally or alternatively, access line 430 and access line 435 may examples of access lines that represent a total number of access lines associated with memory device 400-a.

For example, access line 435 may be referred to as access line "$AL_n$" where "n" is a total number of access lines associated with the memory array, and access line 430 may be referred to as access line "$AL_{n-1}$." In some examples a memory array associated with driver 405 may include 1024 access lines (e.g., word lines), thus access line 430 may represent the 1023rd access line of the memory array, and access line 435 may represent the 1024th access line of the memory array. Each of access lines 420, 425, 430, and 435 may be associated with a respective individual memory cell—e.g., no memory cell 105 may be common across access lines 420, 425, 430, and 435, regardless of whether any of access lines 420, 425, 430, and 435 is associated with a single memory cell 105 or multiple memory cells 105.

In some examples, memory driver 405 may facilitate an access operation of a memory cell coupled with one of access lines 420, 425, 430, or 435. For example, an access operation may be conducted on a memory cell coupled with access line 425, which may be referred to as a second memory cell. A memory controller (e.g., memory controller 140 as described with reference to FIG. 1) may identify an access operation associated with the second memory cell. Driver 405 may then float (e.g., for a duration) first access line 420. In some examples, driver 405 may float each of access lines 420 through 435 other than access line 425. Stated another way, driver 405 may float every unselected access line associated with memory cells 105 having a common plate with the selected memory cell. Floating the unselected access lines may cause a voltage of each unselected access line to track a voltage of the relevant plate (e.g., plate 325 as described with reference to FIG. 3).

In the examples described above, memory driver 405 may include any number of sub-components, and each sub-component may be coupled with any number of access lines. For example memory driver 405 may include a separate driver component for each access line, may include separate driver components for each unique subset of access lines.

Figure 4B:
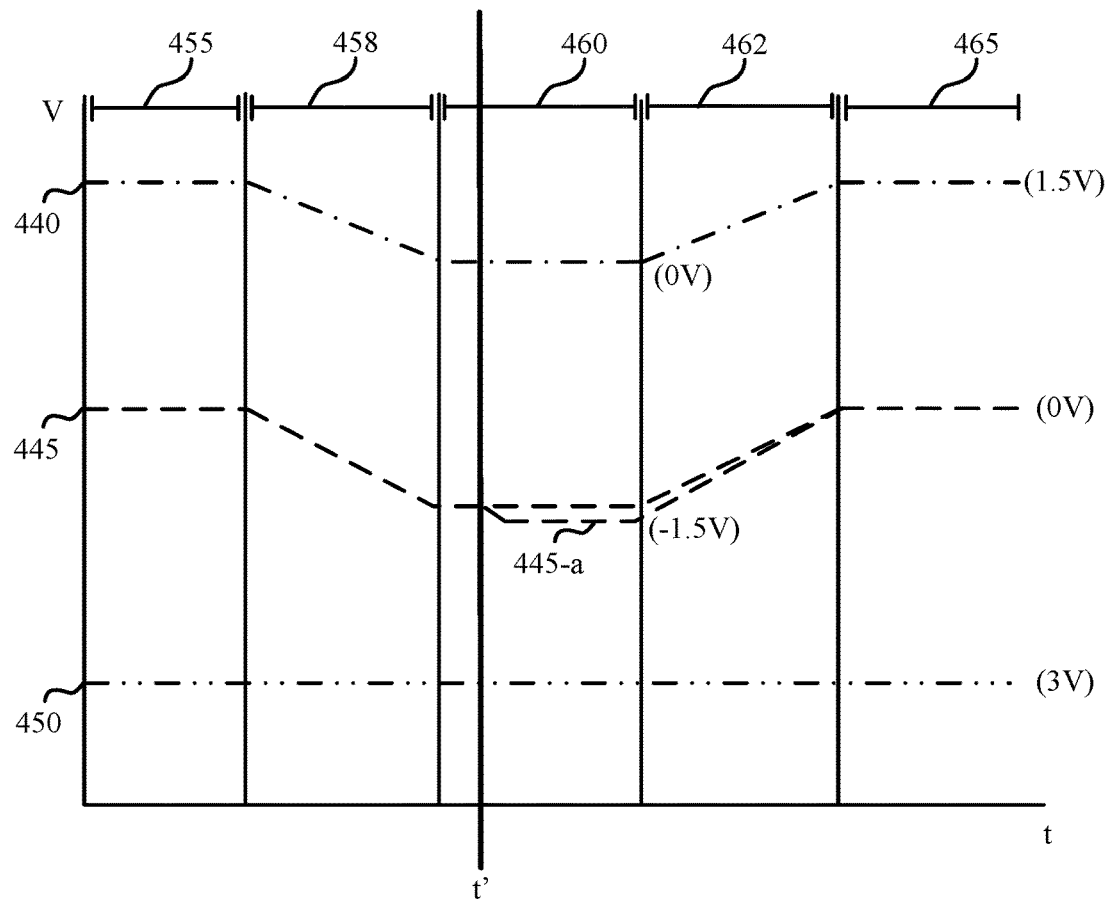

FIG. 4B illustrates an example timing diagram 400-b that supports techniques for access line management for an array of memory cells in accordance with examples of the present disclosure. In some examples, timing diagram 400-b may illustrate an access operation associated with memory device 400-a as described above with reference to FIG. 4A. In some examples, timing diagram 400-b may illustrate voltages of a plate line 440, unselected access lines 445, 445-a, and a selected access line 450 as described above with reference to FIG. 4A. Timing diagram 400-b may illustrate the voltages of plate line 440, unselected access line 445, 445-a, and selected access line 450 during intervals 455, 458, 460, 462 and 465.

As described above, a memory array may include a plurality of respective access lines (e.g., access lines 420, 425, 430, and 435 as described above with reference to FIG. 4A) for a plurality of memory cells, each memory cell having a common plate. Each access line may be referred to as a word line and may be selected or unselected (e.g., by a driver) based on a particular access operation. Any one access line may be selected during a particular access operation, and a remaining number of access lines associated with the plate may remain unselected during the operation. For example, memory cells to which the plate is common may be associated with 1024 access lines (e.g., word lines). Thus, during an access operation, one access line associated with the memory cell to be accessed may be selected (e.g., selected access line 450), and a remaining number of access lines may remain unselected (e.g., unselected access lines 445, 445-a). As described above with reference to FIG. 3, a plate (e.g., plate line 440) may be coupled with the memory array.

An access operation associated with a memory cell may be identified (e.g., by a memory controller 140 as described with reference to FIG. 1). At interval 455, the plate line 440 is shown as initially driven to a first voltage (e.g., a high voltage, such as 1.5V). The selected access line 450 is shown as driven to a high voltage (e.g., 3V), and the unselected access lines 445 are shown as driven to a different voltage (e.g., 0V). The unselected access lines 445 may be referred to as being at a different voltage (e.g., 0V) as the unselected lines may transition between the voltage (e.g., 0V) and a negative voltage during the intervals depicted in FIG. 4B.

At interval 458, the plate line 440 may transition from the first voltage (e.g., the high voltage) to a second voltage (e.g., a low voltage, such as 0V). The selected access line 450 may remain at a high value (e.g., 3V), and the unselected access lines 445 may be floated. In some examples, the unselected access lines 445 may be floated simultaneously with the plate line 440 transitioning to a second voltage, or the unselected access lines 445 may begin being floated some guard period before the plate line 440 transitions to a second voltage to ensure the unselected access lines 445 are floating as the voltage of the plate line 440 begins to transition.

Due to capacitive coupling between the unselected access lines 445 and the plate line 440, floating the unselected access lines 445 may result in a voltage of the unselected access lines 445 tracking a voltage of the plate line 440. Stated another way, as the voltage of the plate line 440 decreases during interval 458, it may pull down the voltage of the floating unselected access lines 445 by an equal or substantially similar amount. For example, if the voltage of the plate line 440 decreases from 1.5V to 0V, the voltage of the unselected access lines 445 may decrease from 0V to or approximately to −1.5V. By allowing the voltage of the unselected access lines 445 to track the voltage of the plate line 440 as the voltage of the plate line 440 changes, a voltage differential between the plate line 440 and the unselected access lines 445 may remain constant or substantially constant. Thus, as the voltage of the plate line 440 changes, a leakage current (e.g., due to capacitive coupling between the plate line 440 and the unselected access lines 445) may be reduced or eliminated, and power consumption associated with the access operation may be reduced.

At interval 460, the plate line 440 may remain at a second voltage (e.g., a low voltage, such as 0V), and the selected access line 450 may remain at a high voltage (e.g., 3V). In some examples, the unselected access lines 445 may continue to float throughout interval 460, and the voltage of the unselected access lines 445 may thus stay at the level obtained at the end of interval 458. In such examples, the difference between the voltage of the unselected access lines 445 and the voltage of the plate line 440 during interval 460 may not be precisely what it was during interval 455. For example, if the voltage of the plate line 440 decreases from 1.5V to 0V, the voltage of the unselected access lines 445 may decrease during interval 458 from 0V to some level near but not precisely equal to −1.5V (e.g., −1.4V), and the voltage of the unselected access lines 445 may remain at that approximate level (e.g., −1.4V) throughout interval 460.

In some examples, after being floated, the unselected access lines 445 may be driven to a desired low voltage based on and compatible with voltage change of the plate line 440 during interval 458, as shown in FIG. 4B by the unselected access line 445-a. The unselected access lines 445-a may be driven to a desired voltage based on the plate voltage swing, for example, such that a subsequent voltage differential between the plate line 440 and the unselected access lines 445-a is ensured to be the same as during interval 455 (e.g., if the voltage of the plate changes from 1.5V to 0V during interval 458, and the voltage of the unselected access lines 445 was 0V during interval 455, the voltage of the unselected access lines 445 may be driven to −1.5V, to ensure a voltage differential of 1.5V).

In some examples, the unselected access lines 445-a may be driven to a desired voltage at the beginning of interval 460 (e.g., once the plate line 440 reaches the second voltage) or at some later time during interval 460 (e.g., at time t'). In other examples, the unselected access lines 445-a may be driven to a desired voltage at the onset of interval 460. Driving the unselected access lines 445 to a desired voltage such to ensure a desired voltage differential relative to the voltage of the plate line 440 (e.g., a voltage differential equal to that during interval 455) may introduce some amount of additional complexity as opposed to continuing to float the unselected access lines 445 throughout interval 460 but may further reduce leakage currents and associated power consumption as a result of change the voltage of the plate line 440 and may provide greater control over the voltage of the unselected access lines 445 during interval 460. Thus, the voltage of the unselected access lines 445 may track the voltage of the plate line 440.

At interval 462, the plate line 440 may be driven from the second voltage (e.g., from a low voltage) to the first voltage (e.g., to a high voltage). The selected access line 450 may remain at a high voltage (e.g., at 3V) and the unselected access lines 445 may be floated (either remain floating in the case it was floated throughout interval 460, or in the case of unselected access line 445-a, begin floating at or some guard period prior to the time the plate line 440 voltage begins transitioning). Because of capacitive coupling between the unselected access lines 445 and the plate line 440, floating the unselected access lines 445 may result in a voltage of the unselected access lines 445 tracking (e.g., tracking substantially) a voltage of the plate line 440. Accordingly, a voltage of the unselected access lines 445 may increase as a voltage of the plate line 440 increases. By tracking a voltage of the plate line 440, a voltage differential between a voltage of the plate line 440 and a voltage of the unselected access lines 445 may remain constant or substantially constant. Thus a leakage current associated with the plate line 440 and the unselected access lines 445 may be mitigated, and power consumption of the associated memory device may be reduced.

At interval 465, the selected access line 450 may remain at a high voltage (e.g., 3V). The plate line 440 may return to a first voltage (e.g., a high voltage) as described at interval 455, and the unselected access lines 445 may be driven to a high voltage (e.g., 0V). As described above, the unselected access lines 445 may be referred to as being at a high voltage (e.g., 0V) due to transitioning between a high voltage (e.g., 0V) and a negative voltage.

Though shown in the example of FIG. 4B as transitioning from a high voltage to a low voltage and back to the high voltage, in some examples, the techniques described herein may apply when the plate line 440 transitions from a low voltage to a high voltage and back to a low voltage. When the plate line 440 transitions from a low voltage to a high voltage or from a high voltage to a low voltage, this may be referred to as toggling or toggling a voltage of the plate line 440. Regardless of the direction of the toggling, the unselected access lines 445, 445-a may be floated when a voltage of the plate line 440 is toggled.

In various examples, plate toggling may occur and thus unselected access lines 445, 445-a may be floated at any time associated with an access operation. For example, the unselected access lines 445, 445-a may be floated before, during, or after the selected memory cell is accessed (e.g., read to or written from).

In some of the examples described herein, operations that support techniques for access line management are described in the context of an array of memory cells having one common plate (that is, common to all memory cells of the array). It is to be understood that the same techniques described herein may be supported by an array of memory cells comprising than one common plate, where each plate may be common to a subset of memory cells of the array. Accordingly, the techniques described herein may apply in the context of a memory array having any number of plates.

In the examples described herein, the absolute voltage levels described (e.g., 3V, 0V, −1.5V, etc.) are for illustrative purposes only. Thus, any absolute voltage level(s) may be used that are different than the absolute voltage levels described herein.

Figure 5A:
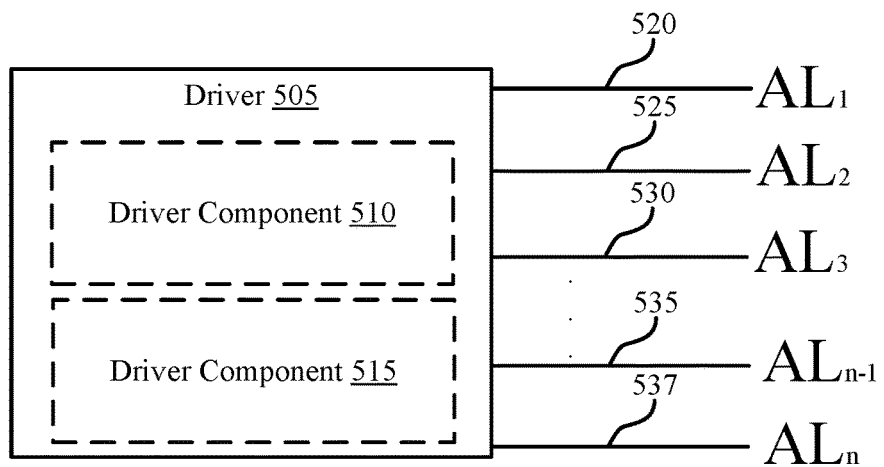
FIGS. 5A and 5B illustrate an example of a memory device and timing diagram that support techniques for access line management in accordance with examples of the present disclosure.

FIG. 5A illustrates examples of a memory device 500-a that supports techniques for access line management for an array of memory cells in accordance with examples of the present disclosure. In some examples, memory device 500-a may include driver 505, which may be referred to as memory driver 505. Memory driver 505 may be coupled with any number of access lines, and may facilitate an access operation of one or more memory cells (e.g., memory cells 305-a through 305-f as described with reference to FIG. 3). Memory driver 505 may be coupled with, for example, access line 520, access line 525, access line 530, access line 535, and access line 537. Each of access lines 520, 525, 530, 535, and 537 may be examples of a word line (e.g., word lines 310-a, 310-b as described with reference to FIG. 3) of a memory array. Memory driver 505 may include various sub-components, such as driver component 510 and driver component 515. In other examples (not shown), memory driver 505 may contain any number of sub-components (e.g., any number of driver components).

As described above, each of access lines 520, 525, 530, 535, and 537 may be examples of a word line of a memory array (e.g., memory array 320 as described with reference to FIG. 3). For example, access line 520 may be or may be referred to as a first access line 520, access line 525 may be or may be referred to as second access line 525, and access line 530 may be or may be referred to as third access line 530.

Additionally or alternatively, access line 430 and access line 435 may examples of access lines that represent a total number of access lines associated with memory device 500-a. For example, access line 537 may be referred to as access line "$AL_n$" where "n" is a total number of access lines associated with the memory array, and access line 535 may be referred to as access line "$AL_{n-1}$." In some examples a memory array associated with driver 505 may include 1024 access lines (e.g., word lines), thus access line 535 may represent the 1023rd access line of the memory array, and access line 537 may represent the 1024th access line of the memory array. Each of access lines 520, 525, 530, 535, and 537 may be associated with an individual memory cell— e.g., no memory cell 105 may be common across access lines 520, 525, 530, 535, and 537, regardless of whether any of access lines 520, 525, 530, 535, and 537 is associated with a single memory cell 105 or multiple memory cells 105.

In some examples, memory driver 505 may facilitate an access operation of a memory cell coupled with one of access lines 520, 525, 530, 535, and 537. For example, an access operation may be conducted on a memory cell coupled with access line 525, which may be referred to as a second memory cell. In some examples, a memory controller (e.g., memory controller 140 as described with reference to FIG. 1) may identify an access operation associated with the second memory cell. Driver 505 may then float (e.g., for a duration) first access line 520. In other examples, driver 505 may float each of access lines 520 through 537 other than access line 525. Stated another way, driver 505 may float every unselected access line associated with memory cells 105 having a common plate with the selected memory cell. By floating the unselected access lines, a voltage of each unselected access line may track a voltage of relevant the plate (e.g., plate 325 as described with reference to FIG. 3).

In some examples, driver 505 may float the unselected access lines using multiple floating operations and/or using multiple sub-components. For example, a first subset of unselected access lines may be floated using a first floating operation and/or a first combination of sub-components of driver 505, and a second subset of unselected access lines may be floated using a second floating operation and/or a second combination of sub-components of driver 505. Because driver 505 may be coupled with all but one unselected access line, depending on the size of the memory array (e.g., coupled with 1023 of 1024 unselected access lines), the first subset of unselected access lines floated using a first floating operation and/or a first combination of sub-components and the second subset of unselected access lines floated using a second floating operation and/or a second combination of sub-components may total 1023 access lines.

In some cases, a sub-component of driver 505 (e.g., driver component 510) may be common to a selected access line (e.g., access line 520) and one or more unselected access lines (e.g., access lines 525, 530), while one or more other sub-components of driver 505 (e.g., driver component 515) may be common to a plurality of other unselected access lines (e.g., access lines 535, 537). In such an example, driver component 510 may operate unselected access lines 525, 530 differently than the manner in which driver component 515 may operate unselected access lines 535, 537. For example, whereas driver component 515 may operate unselected access lines 535, 537 substantially as described in reference to FIG. 4, driver component 510 may drive (rather than float) unselected access lines 525, 530 to a voltage configured to minimize voltage stress on components (e.g., transistors) within driver component 510, as driver component 510 is common with the selected access line 520.

In the examples described above, memory driver 505 may include any number of sub-components, and each sub-component may be coupled any number of access lines. For example, memory driver 505 may include a separate driver component for each access line or may include separate driver components for each unique subset of access lines.

Figure 5B:
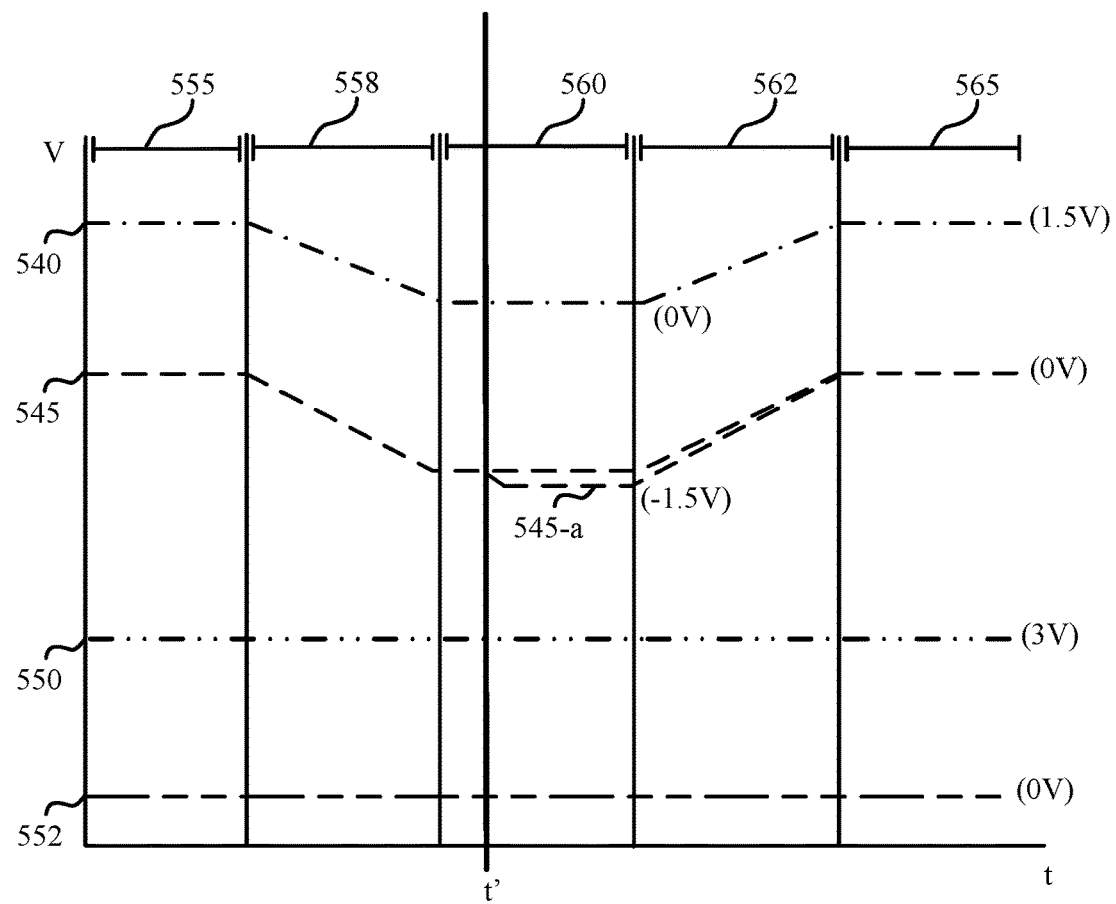

FIG. 5B illustrates an example timing diagram 500-b that supports techniques for access line management for an array of memory cells in accordance with examples of the present disclosure. In some examples, timing diagram 500-b may illustrate an access operation associated with memory device 500-a as described above with reference to FIG. 5A. In some examples, timing diagram 500-b may illustrate voltages of a plate line 540, unselected access lines 545, 545-a, a selected access line 550, and a subset of unselected access lines 552.

Timing diagram 500-b may illustrate the voltages of plate line 540, unselected access line 545, 545-a, selected access line 550, and the subset of unselected access lines 552 during intervals 555, 558, 560, 562 and 565. In some examples, subset of unselected access lines 552 may be or may refer to unselected access lines that share one or more drivers or driver components (e.g., driver component 510 as described above with reference to FIG. 5A) with the selected access line 550.

As described above, a memory array may include a plurality of respective access lines (e.g., access lines 520, 525, 530, 535, and 537 as described above with reference to FIG. 5A) for a plurality of memory cells, each memory cell having a common plate. Each access line may be referred to as a word line and may be selected or unselected (e.g., by a driver) based on a particular access operation. Any one access line may be selected during a particular access operation, and a remaining number of access lines associated with the plate may remain unselected during the operation. For example, memory cells to which the plate is common may be associated with 1024 access lines (e.g., word lines). Thus, during an access operation, one access line associated with the memory cell to be accessed may be selected (e.g., selected access line 550), and a remaining number of access lines may remain unselected (e.g., unselected access lines 545, 545-a). As described above with reference to FIG. 3, a plate (e.g., plate line 540) may be coupled with the memory array.

An access operation associated with a memory cell may be identified (e.g., by a memory controller 140 as described with reference to FIG. 1). At interval 555, the plate line 540 is shown as initially driven to a first voltage (e.g., a high voltage). The selected access line 550 is shown as driven to a high voltage (e.g., 3V), and the unselected access lines 445, 552 are shown as driven to a different voltage (e.g., 0V). The unselected access lines 445 may be referred to as being at a different voltage (e.g., 0V) as the unselected lines may transition between the voltage (e.g., 0V) and a negative voltage.

At interval 558, the plate line 540 may transition from a first voltage (e.g., a high voltage) to a second voltage (e.g., a low voltage). The selected access line 550 may remain at a high value (e.g., 3V), and the unselected access lines 545 may be floated. In some examples, the unselected access lines 545 may begin being floated simultaneously with the plate line 540 transitioning to a second voltage, or the unselected access lines 545 may begin being floated before the plate line 540 transitions to a second voltage. Due to capacitive coupling between the unselected access lines and the plate line 540, floating the unselected access lines 545 may result in a voltage of the unselected access lines 545 tracking a voltage of the plate line 540. Stated another way, as the voltage of the plate line 540 decreases during interval 558, it may pull down the voltage of the floating unselected access lines 545 by an equal or substantially similar amount.

For example, if the voltage of the plate line 540 decreases from 1.5V to 0V, the voltage of the unselected access lines 545 may decrease from 0V to or to approximately −1.5V. By allowing the voltage of the unselected access lines 545 to track the voltage of the plate line 540 as the voltage of the plate line 540 changes, a voltage differential between the plate line 540 and the unselected access lines 545 may remain constant or substantially constant. Thus, as the voltage of the plate line 540 changes, a leakage current (e.g., due to capacitive coupling between the plate line 540 and the unselected access lines 545) may be reduced or eliminated, and power consumption associated with the access operation may be reduced.

At interval 560, the plate line 540 may remain at the second voltage (e.g., a low voltage), and the selected access line 550 may remain at a high voltage (e.g., 3V). In some examples, the unselected access lines 545 may continue to float throughout interval 560, and the voltage of the unselected access liens 545 may thus stay at the level obtained at the end of interval 558. In such examples, the difference between the voltage of the unselected access lines 545 and the voltage of the plate line 540 during interval 560 may not be precisely what it was during interval 555. For example, if the voltage of the plate line 540 decreases from 1.5V to 0V, the voltage of the unselected access lines 545 may decrease during interval 558 from 0V to some level near but not precisely equal to −1.5V (e.g., −1.4V), and the voltage of the unselected access lines 545 may remain at that approximate level (e.g., −1.4V) throughout interval 560.

In some examples, after being floated, the unselected access lines 545 may be driven to a desired low voltage based on and compatible with voltage change of the plate line 540 during interval 458, as shown in FIG. 5B by the unselected access line 545-*a*. The unselected access lines 545-*a* may be driven to a desired voltage based on the plate voltage swing, for example, such that a subsequent voltage differential between the plate line 540 and the unselected access lines 545-*a* is ensured to be the same as during interval 555 (e.g., if the voltage of the plate changes from 1.5V to 0V during interval 558, and the voltage of the unselected access lines 545 was 0V during interval 555, the voltage of the unselected access lines 545 may be driven to −1.5V, to ensure a voltage differential of 1.5V).

In some examples, the unselected access lines 545-*a* may be driven to a desired voltage at the beginning of interval 560 (e.g., once the plate line 540 reaches the second voltage) or at some late time during interval 560 (e.g., at time t'). In other examples, the unselected access lines 545-*a* may be driven to a desired voltage at the onset of interval 560. Driving the unselected access lines 545 to a desired voltage such to ensure a desired voltage differential relative to the voltage of the plate line 540 (e.g., a voltage differential equal to that during interval 555) may introduce some amount of additional complexity as opposed to continuing to float the unselected access lines 545 throughout interval 460 but may further reduce leakage currents and associated power consumption as a result of change the voltage of the plate line 540 and may provide greater control over the voltage of the unselected access lines 545 during interval 560. Thus, the voltage of the unselected access lines 545 may track the voltage of the plate line 540.

At interval 562, the plate line 540 may be driven from the second voltage (e.g., from a low voltage) to the first voltage (e.g., to a high voltage). The selected access line 550 may remain at a high voltage (e.g., at 3V) and the unselected access lines 545 may be floated (either remain floating in the case it was floated throughout interval 460, or in the case of unselected access line 545-*a*, begin floating at or some guard period prior to the time the plate line 540 voltage begins transitioning). Because of capacitive coupling between the unselected access lines 545 and the plate line 540, floating the unselected access lines 545 may result in a voltage of the unselected access lines 545 tracking (e.g., tracking substantially) a voltage of the plate line 540. Accordingly, a voltage of the unselected access lines 545 may increase as a voltage of the plate line 540 increases. By tracking a voltage of the plate line 540, a voltage differential between a voltage of the plate line 540 and a voltage of the unselected access lines 545 may be limited. Thus a leakage current associated with the plate line 540 and the unselected access lines 545 may be mitigated, and power consumption of the associated memory device may be reduced.

At interval 565, the selected access line 550 may remain at a high voltage (e.g., 3V). The plate line 540 may return to a first voltage (e.g., a high voltage) as described at interval 555, and the unselected access lines 545 may be driven to a high voltage (e.g., 0V). As described above, the unselected access lines 545 may be referred to as being at a high voltage (e.g., 0V) due to transitioning between a high voltage (e.g., 0V) and a negative voltage.

As described above, the subset of unselected access lines 552 may be maintained at a constant voltage (e.g., 0V) throughout intervals 555, 558, 560, 562, and 565. Because the subset of unselected access lines 552 may be or may refer to unselected access lines that share one or more driver components (e.g., driver component 510 as described above with reference to FIG. 5A) with the selected access line 550, such a configuration may add additional complexity to the memory device (e.g., memory device 500-*a* as described with reference to FIG. 5A; as compared with memory device 400-*a* as described with reference to FIG. 4A). However, in some examples, such a configuration may reduce voltage stress and thus a requisite voltage tolerance of one or more transistors (e.g., one or more transistors located within the driver component) common between the unselected access lines 545, 545-*a* and the selected access line 550.

Additionally or alternatively, a voltage differential between the selected access line 550 and the subset of unselected access lines 552 may be less than a voltage differential between the selected access line 450 and the unselected access lines 445, 445-*a* as described above with reference to FIG. 4B. For example, as described above with reference to FIG. 4B, a voltage differential between the selected access line 450 and the unselected access lines 445, 445-*a* may be 4.5V (e.g., unselected access lines 445, 445-*a* at −1.5V; selected access line at 3V). As described with reference to FIG. 5B, a voltage differential between the selected access line 450 and the subset of unselected access lines 552 may be 3V (e.g., subset of unselected access lines 552 at 0V; selected access line at 3V). It is to be understood that, where a driver 505 comprises multiple driver components 510, each driver component may support operating any one corresponding access line as described with reference to selected access line 550 while operating any other corresponding access lines as described with reference to the subset of unselected access lines 552, as well as operating all corresponding access line as described with reference to unselected access lines 545, depending on whether any access line corresponding to the driver component 510 is selected.

Though shown in the example of FIG. 5B as transitioning from a high voltage to a low voltage and back to the high voltage, in some examples, the techniques described herein may apply when the plate line 540 transitions from a low voltage to a high voltage or from a high voltage to a low voltage, this may be referred to as toggling or toggling a voltage of the plate line 540. Regardless of the direction of the toggling, the unselected access lines 545, 545-*a* and/or the subset of unselected access lines 552 may be floated when a voltage of the plate line 540 is toggled.

In various examples, plate toggling may occur and thus unselected access lines 545, 545-*a* and/or the subset of unselected access lines 552 may be floated at any time associated with an access operation. For example, the unselected access lines 545, 545-a and/or the subset of unselected access lines 552 may be floated before, during, or after the selected memory cell is accessed (e.g., read to or written from).

In some of the examples described herein, operations that support techniques for access line management are described in the context of an array of memory cells having one common plate (that is, common to all memory cells of the array). It is to be understood that the same techniques described herein may be supported by an array of memory cells comprising more than one common plate, where each plate may be common to a subset of memory cells of the array. Accordingly, the techniques described herein may apply in the context of a memory array having any number of plates.

In the examples described herein, the absolute voltage levels described (e.g., 3V, 0V, −1.5V, etc.) are for illustrative purposes only. Thus, any absolute voltage level(s) may be used that are different than the absolute voltage levels described herein.

Figure 6:
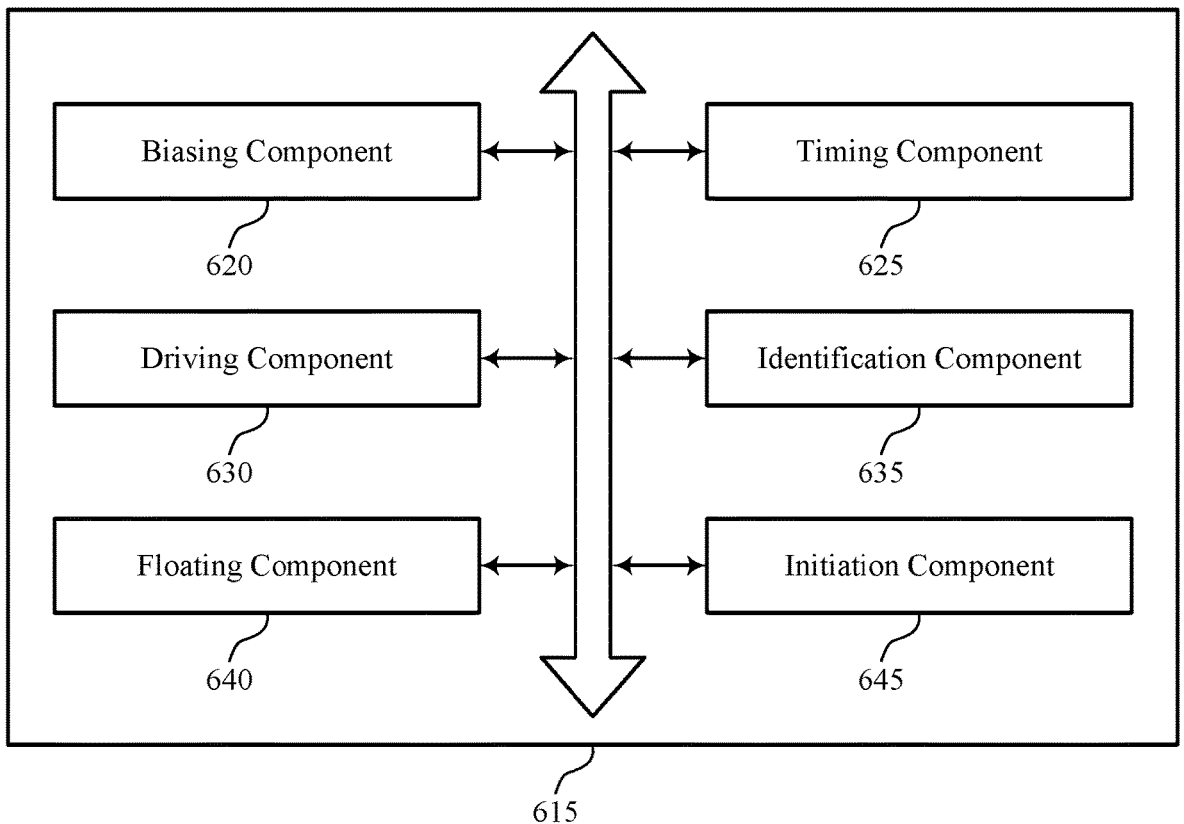
FIGS. 6 and 7 show block diagrams of a device that supports techniques for access line management in accordance with examples of the present disclosure.

FIG. 6 shows a block diagram 600 of an access line manager 615 that supports access line management for an array of memory cells in accordance with examples of the present disclosure. The access line manager 615 may be an example of aspects of an access line manager 715 described with reference to FIG. 7. The access line manager 615 may include biasing component 620, timing component 625, driving component 630, identification component 635, floating component 640, and initiation component 645. Each of these modules may communicate, directly or indirectly, with one another (e.g., via one or more buses).

Driving component 630 may drive a plate coupled with at least a first memory cell of an array of memory cells to a first voltage. In some examples, driving component 630 may drive, during the duration, the plate from the first voltage to a second voltage based on the access operation associated with the second memory cell. In other examples, driving component 630 may drive the first access line to the desired voltage after the duration based at least in part on a difference between the first voltage and the second voltage. Additionally or alternatively, driving component 630 may drive the plate from the second voltage to the first voltage. In some examples, driving component 630 may drive a second access line coupled with the second memory cell to a third voltage during the duration. In other examples, driving component 630 may drive a third access line coupled with a third memory cell to a fourth voltage during the duration while driving the plate from the first voltage to the second voltage.

Identification component 635 may identify an access operation associated with a second memory cell of the array of memory cells.

Floating component 640 may float, for a duration, a first access line coupled with the first memory cell of the array of memory cells based on the access operation associated with the second memory cell. In other examples, floating component 640 may float the first access line after driving the first access line to the desired voltage while driving the plate from the second voltage to the first voltage. In other examples, floating component 640 may float the first access line for a second duration immediately subsequent to the duration. Additionally or alternatively, floating component 640 may float the first access line and drive the plate to the second voltage concurrently.

Initiation component 645 may initiate driving the third access line to a fifth voltage. The fifth voltage may be associated with a second logic value of the third memory cell. In some examples, initiation component 645 may initiate driving the plate from a first voltage to a second voltage based on the access operation associated with the second memory cell. In some examples, initiation component 645 may initiate floating the first access line based on the access operation associated with the second memory cell. Additionally or alternatively, initiation component 645 may initiate driving a third access line associated with a third memory cell of the set of memory cells to a third voltage based on the access operation associated with the second memory cell.

It is to be understood that in some instances, one or more components of access line manager 615 may be combined (e.g., biasing component 620, driving component 630, and floating component 640).

Figure 7:
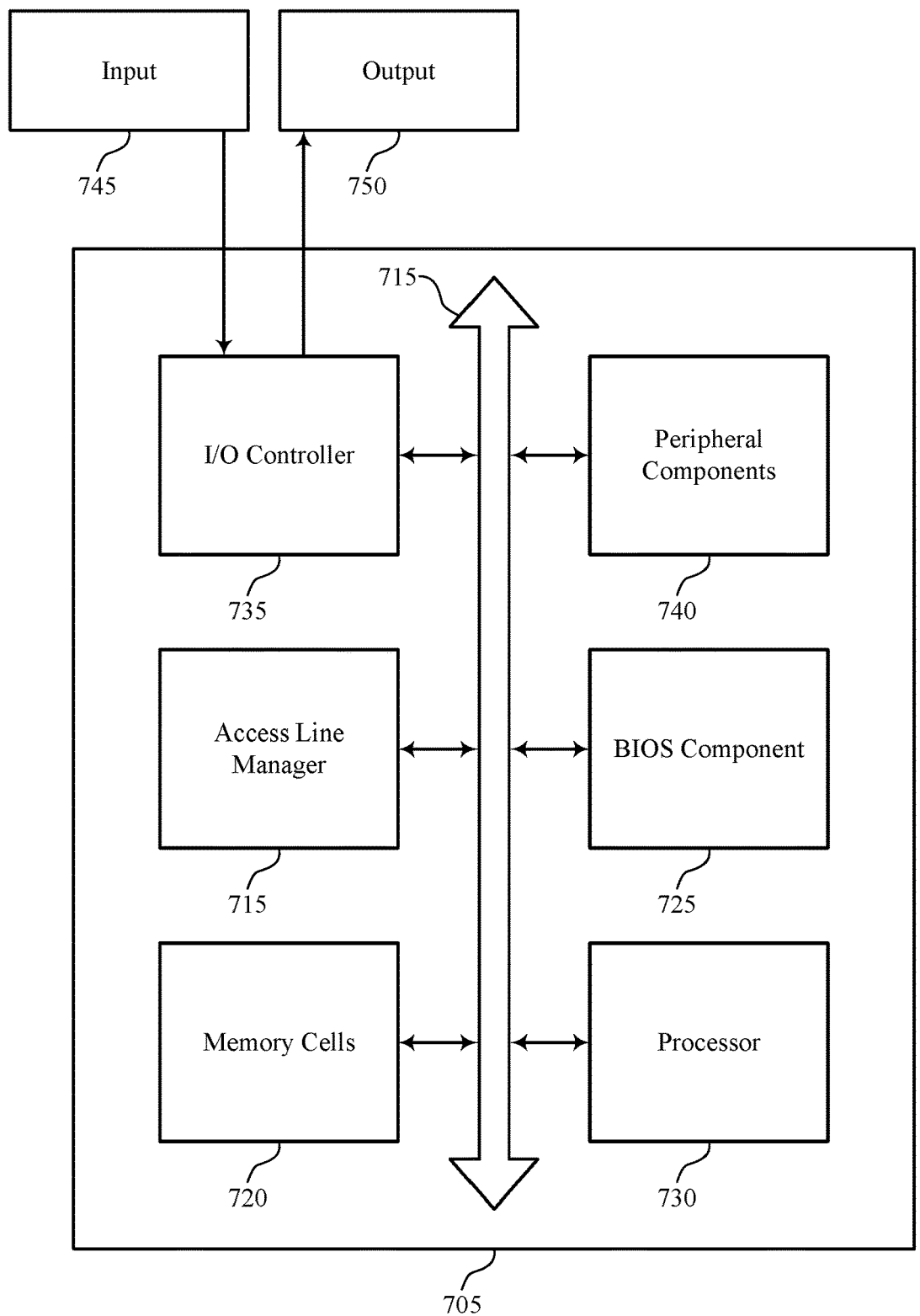

FIG. 7 shows a diagram of a system 700 including a device 705 that supports access line management for an array of memory cells in accordance with examples of the present disclosure. Device 705 may be an example of or include the components of memory array 100 as described above, e.g., with reference to FIG. 1. Device 705 may include components for bi-directional voice and data communications including components for transmitting and receiving communications, including access line manager 715, memory cells 720, basic input/output system (BIOS) component 725, processor 730, I/O controller 735, and peripheral components 740. These components may be in electronic communication via one or more buses (e.g., bus 710).

Memory cells 720 may store information (i.e., in the form of a logical state) as described herein.

BIOS component 725 be a software component that includes BIOS operated as firmware, which may initialize and run various hardware components. BIOS component 725 may also manage data flow between a processor and various other components, e.g., peripheral components, input/output control component, etc. BIOS component 725 may include a program or software stored in read only memory (ROM), flash memory, or any other non-volatile memory.

Processor 730 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 730 may be configured to operate a memory array using a memory controller. In other cases, a memory controller may be integrated into processor 730. Processor 730 may be configured to execute computer-readable instructions stored in a memory to perform various functions (e.g., functions or tasks supporting access line management for an array of memory cells).

I/O controller 735 may manage input and output signals for device 705. I/O controller 735 may also manage peripherals not integrated into device 705. In some cases, I/O controller 735 may represent a physical connection or port to an external peripheral. In some cases, I/O controller 735 may utilize an operating system such as iOS®, ANDROID®, MS-DOS®, MS-WINDOWS®, OS/2®, UNIX®, LINUX®, or another known operating system. In other cases, I/O controller 735 may represent or interact with a modem, a keyboard, a mouse, a touchscreen, or a similar device. In some cases, I/O controller 735 may be implemented as part of a processor. In some cases, a user may interact with device 705 via I/O controller 735 or via hardware components controlled by I/O controller 735.

Peripheral components 740 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 745 may represent a device or signal external to device 705 that provides input to device 705 or its components. This may include a user interface or an interface with or between other devices. In some cases, input 745 may be managed by I/O controller 735, and may interact with device 705 via a peripheral component 740.

Output 750 may also represent a device or signal external to device 705 configured to receive output from device 705 or any of its components. Examples of output 750 may include a display, audio speakers, a printing device, another processor or printed circuit board, etc. In some cases, output 750 may be a peripheral element that interfaces with device 705 via peripheral component(s) 740. In some cases, output 750 may be managed by I/O controller 735

The components of device 705 may include circuitry designed to carry out their functions. This may include various circuit elements, for example, conductive lines, transistors, capacitors, inductors, resistors, amplifiers, or other active or inactive elements, configured to carry out the functions described herein. Device 705 may be a computer, a server, a laptop computer, a notebook computer, a tablet computer, a mobile phone, a wearable electronic device, a personal electronic device, or the like. Or device 705 may be a portion or aspect of such a device.

FIG. 8 shows a flowchart illustrating a method 800 for access line management for an array of memory cells in accordance with examples of the present disclosure. The operations of method 800 may be implemented by a memory controller its components as described herein. For example, the operations of method 800 may be performed by an access line manager as described with reference to FIG. 6.

At 805 the memory array 100 a plate coupled with at least a first memory cell of an array of memory cells may be driven to a first voltage. The operations of 805 may be performed according to the methods described herein. In certain examples, aspects of the operations of 805 may be performed by a driving component as described with reference to FIG. 6.

At 810 an access operation associated with a second memory cell of the array of memory cells may be identified. The operations of 810 may be performed according to the methods described herein. In certain examples, aspects of the operations of 810 may be performed by an identification component as described with reference to FIG. 6.

At 815 a first access line coupled with the first memory cell of the array of memory cells may be floated, for a duration, based at least in part on the access operation associated with the second memory cell. The operations of 815 may be performed according to the methods described herein. In certain examples, aspects of the operations of 815 may be performed by a floating component as described with reference to FIG. 6.

At 820 the plate may be driven, during the duration, from the first voltage to a second voltage based at least in part on the access operation associated with the second memory cell. The operations of 820 may be performed according to the methods described herein. In certain examples, aspects of the operations of 820 may be performed by a driving component as described with reference to FIG. 6.

FIG. 9 shows a flowchart illustrating a method 900 for access line management for an array of memory cells in accordance with examples of the present disclosure. The operations of method 900 may be implemented by a memory controller or its components as described herein. For example, the operations of method 900 may be performed by an access line manager as described with reference to FIG. 6.

At 905 a plate coupled with at least a first memory cell of an array of memory cells may be driven to a first voltage. The operations of 905 may be performed according to the methods described herein. In certain examples, aspects of the operations of 905 may be performed by a driving component as described with reference to FIG. 6.

At 910 access operation associated with a second memory cell of the array of memory cells may be identified. The operations of 910 may be performed according to the methods described herein. In certain examples, aspects of the operations of 910 may be performed by an identification component as described with reference to FIG. 6.

At 915 a first access line coupled with the first memory cell of the array of memory cells may be floated, for a duration, based at least in part on the access operation associated with the second memory cell. The operations of 915 may be performed according to the methods described herein. In certain examples, aspects of the operations of 915 may be performed by a floating component as described with reference to FIG. 6.

At 920 the plate may be driven, during the duration, from the first voltage to a second voltage based at least in part on the access operation associated with the second memory cell. The operations of 920 may be performed according to the methods described herein. In certain examples, aspects of the operations of 920 may be performed by a driving component as described with reference to FIG. 6.

At 925 the first access line may be driven to a desired voltage after the duration based at least in part on a difference between the first voltage and the second voltage. The operations of 925 may be performed according to the methods described herein. In certain examples, aspects of the operations of 925 may be performed by a driving component as described with reference to FIG. 6.

FIG. 10 shows a flowchart illustrating a method 1000 for access line management for an array of memory cells in accordance with examples of the present disclosure. The operations of method 1000 may be implemented by a memory controller or its components as described herein. For example, the operations of method 1000 may be performed by an access line manager as described with reference to FIG. 6.

At 1005 a plate coupled with at least a first memory cell of an array of memory cells may be driven to a first voltage. The operations of 1005 may be performed according to the methods described herein. In certain examples, aspects of the operations of 1005 may be performed by a driving component as described with reference to FIG. 6.

At 1010 access operation associated with a second memory cell of the array of memory cells may be identified. The operations of 1010 may be performed according to the methods described herein. In certain examples, aspects of the operations of 1010 may be performed by an identification component as described with reference to FIG. 6.

At 1015 a first access line coupled with the first memory cell of the array of memory cells may be floated, for a duration, based at least in part on the access operation associated with the second memory cell. The operations of 1015 may be performed according to the methods described herein. In certain examples, aspects of the operations of 1015 may be performed by a floating component as described with reference to FIG. 6.

At 1020 the plate may be driven, during the duration, from the first voltage to a second voltage based at least in part on the access operation associated with the second memory cell. The operations of 1020 may be performed according to the methods described herein. In certain examples, aspects of the operations of 1020 may be performed by a driving component as described with reference to FIG. 6.

At 1025 a first access line may be floated for a second duration immediately subsequent to the duration. The operations of 1025 may be performed according to the methods described herein. In certain examples, aspects of the operations of 1025 may be performed by a floating component as described with reference to FIG. 6.

In some cases, the method may include driving a plate coupled with at least a first memory cell of an array of memory cells to a first voltage. In some examples, floating the first access line and driving the plate to the second voltage may occur concurrently. In other examples, the method may include floating, for a duration, a first access line coupled with the first memory cell of the array of memory cells based at least in part on the access operation associated with the second memory cell.

In some cases, the method may include driving, during the duration, the plate from the first voltage to a second voltage based at least in part on the access operation associated with the second memory cell. In some examples, the method may include driving the first access line to the desired voltage after the duration based at least in part on a difference between the first voltage and the second voltage. Additionally or alternatively, the method may include driving the plate from the second voltage to the first voltage. In other cases, the method may include identifying an access operation associated with a second memory cell of the array of memory cells.

In some cases, the method may include driving a second access line coupled with the second memory cell to a third voltage during the duration. In some examples, the method may include driving a third access line coupled with a third memory cell to a fourth voltage during the duration while driving the plate from the first voltage to the second voltage. In some cases, the method may include floating the first access line for a second duration immediately subsequent to the duration. Additionally or alternatively, the plate may be coupled with a plurality of memory cells of the array of memory cells. The plurality of memory cells may include the first memory cell and the second memory cell.

In some cases, the plate may be coupled with multiple rows or multiple columns of memory cells of a first deck of the array of memory cells and with multiple rows or multiple columns of memory cells of a second deck of the array of memory cells. In other cases, the method may include floating the first access line after driving the plate to the second voltage while driving the plate from the second voltage to the first voltage.

It should be noted that the methods described above describe possible implementations, and that the operations and the steps may be rearranged or otherwise modified and that other implementations are possible. Furthermore, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   driving a plate coupled with at least a first memory cell of an array of memory cells to a first voltage;
   identifying an access operation associated with a second memory cell of the array of memory cells;
   floating, for a duration, a first access line coupled with the first memory cell of the array of memory cells based at least in part on the access operation associated with the second memory cell;
   driving, during the duration, the plate from the first voltage to a second voltage based at least in part on the access operation associated with the second memory cell; and
   driving the first access line, after the duration, to a desired voltage based at least in part on a difference between the first voltage and the second voltage.

2. The method of claim 1, further comprising:
   driving the plate from the second voltage to the first voltage; and
   floating the first access line after driving the first access line to the desired voltage while driving the plate from the second voltage to the first voltage.

3. The method of claim 1, further comprising:
driving a second access line coupled with the second memory cell to a third voltage during the duration.

4. A method, comprising:
driving a plate coupled with at least a first memory cell of an array of memory cells to a first voltage;
identifying an access operation associated with a second memory cell of the array of memory cells;
floating, for a duration, a first access line coupled with the first memory cell of the array of memory cells based at least in part on the access operation associated with the second memory cell;
driving, during the duration, the plate from the first voltage to a second voltage based at least in part on the access operation associated with the second memory cell;
driving a second access line coupled with the second memory cell to a third voltage during the duration; and
driving a third access line coupled with a third memory cell to a fourth voltage during the duration while driving the plate from the first voltage to the second voltage.

5. A method, comprising:
driving a plate coupled with at least a first memory cell of an array of memory cells to a first voltage;
identifying an access operation associated with a second memory cell of the array of memory cells;
floating, for a duration, a first access line coupled with the first memory cell of the array of memory cells based at least in part on the access operation associated with the second memory cell;
driving, during the duration, the plate from the first voltage to a second voltage based at least in part on the access operation associated with the second memory cell; and
floating the first access line for a second duration immediately subsequent to the duration.

6. The method of claim 1, wherein the plate is coupled with a plurality of memory cells of the array of memory cells, the plurality of memory cells comprising the first memory cell and the second memory cell.

7. The method of claim 1, wherein the plate is coupled with multiple rows or multiple columns of memory cells of a first deck of the array of memory cells and with multiple rows or multiple columns of memory cells of a second deck of the array of memory cells.

8. The method of claim 1,
wherein floating the first access line and driving the plate to the second voltage occur concurrently.

9. An apparatus, comprising:
an array of memory cells that includes a first memory cell and a second memory cell;
a first access line coupled with the first memory cell;
an access line driver coupled with the first access line, the access line driver configured to float the first access line during a duration based at least in part on an access operation associated with the second memory cell;
a plate coupled with the first memory cell and the second memory cell;
a plate line driver coupled with the plate, the plate line driver configured to drive the plate to a first voltage before the duration, and drive the plate to a second voltage during the duration based at least in part on the access operation associated with the second memory cell; and the access line driver is further configured to drive the first access line to a desired voltage after the duration based at least in part on a difference between the first voltage and the second voltage.

10. The apparatus of claim 9, wherein the first access line comprises an unselected access line.

11. The apparatus of claim 9, wherein a second access line coupled with the second memory cell, the second access line comprising a selected access line.

12. The apparatus of claim 11, wherein the access line driver is coupled with the second access line and further configured to drive the second access line to a third voltage, the third voltage associated with a first logic value of the second memory cell.

13. An apparatus, comprising:
an array of memory cells that includes a first memory cell and a second memory cell;
a first access line coupled with the first memory cell;
an access line driver coupled with the first access line, the access line driver configured to float the first access line during a duration based at least in part on an access operation associated with the second memory cell;
a plate coupled with the first memory cell and the second memory cell;
a plate line driver coupled with the plate, the plate line driver configured to drive the plate to a first voltage before the duration, and drive the plate to a second voltage during the duration based at least in part on the access operation associated with the second memory cell;
a second access line coupled with the second memory cell, the second access line comprising a selected access line; and
a third access line coupled with a third memory cell, the third access line comprising an unselected access line, wherein the access line driver is coupled with the second access line and the third access line.

14. The apparatus of claim 13, wherein the access line driver is further configured to:
drive the second access line a fourth voltage, the fourth voltage associated with a first logic value of the second memory cell; and
drive the third access line to a fifth voltage, the fifth voltage associated with a second logic value of the third memory cell.

15. The apparatus of claim 9, wherein the access line driver is further configured to continue floating the first access line after the duration.

16. The apparatus of claim 9, where the array of memory cells comprises a plurality of ferroelectric memory cells.

17. An apparatus, comprising:
a plate coupled with a plurality of memory cells that includes a first memory cell and a second memory cell;
a plate driver coupled with the plate;
a first access line coupled with the first memory cell;
an access line driver coupled with the first access line;
a controller configured to:
identify an access operation associated with the second memory cell;
initiate driving the plate from a first voltage to a second voltage based at least in part on the access operation associated with the second memory cell;
initiate floating the first access line based at least in part on the access operation associated with the second memory cell; and initiate driving the first access line to a desired voltage after the plate is at the second voltage based at least in part on a difference between the first voltage and the second voltage.

18. The apparatus of claim 17, wherein the controller is further configured to continue floating the first access line after the plate is at the second voltage.

19. The apparatus of claim 17, wherein the controller is further configured to concurrently initiate floating the first access line and driving the plate to the second voltage.

20. The apparatus of claim 17, wherein the controller is further configured to initiate floating the first access line before initiating driving the plate to the second voltage.

21. The apparatus of claim 17, wherein the controller is further configured to initiate selecting a second access line coupled with the second memory cell based at least in part on the access operation associated with the second memory cell.

22. An apparatus, comprising:
a plate coupled with a plurality of memory cells that includes a first memory cell and a second memory cell;
a plate driver coupled with the plate;
a first access line coupled with the first memory cell;
an access line driver coupled with the first access line;
a controller configured to:
identify an access operation associated with the second memory cell;
initiate driving the plate from a first voltage to a second voltage based at least in part on the access operation associated with the second memory cell;
initiate floating the first access line based at least in part on the access operation associated with the second memory cell;
initiate selecting a second access line coupled with the second memory cell based at least in part on the access operation associated with the second memory cell; and
initiate driving a third access line associated with a third memory cell of the plurality of memory cells to a third voltage based at least in part on the access operation associated with the second memory cell.

23. The method of claim 5, wherein the plate is coupled with a plurality of memory cells of the array of memory cells, the plurality of memory cells comprising the first memory cell and the second memory cell.

24. The method of claim 5, wherein the plate is coupled with multiple rows or multiple columns of memory cells of a first deck of the array of memory cells and with multiple rows or multiple columns of memory cells of a second deck of the array of memory cells.

25. The method of claim 5,
wherein floating the first access line and driving the plate to the second voltage occur concurrently.

* * * * *